(12) United States Patent
Hwang

(10) Patent No.: US 9,160,324 B2
(45) Date of Patent: Oct. 13, 2015

(54) BUFFER CIRCUIT

(71) Applicant: SK hynix Inc., Gyeonggi-do (KR)

(72) Inventor: Tae-Jin Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/082,850

(22) Filed: Nov. 18, 2013

(65) Prior Publication Data

US 2015/0042394 A1 Feb. 12, 2015

(30) Foreign Application Priority Data

Aug. 9, 2013 (KR) ........................ 10-2013-0094873

(51) Int. Cl.
*H03L 5/00* (2006.01)
*H03K 6/04* (2006.01)
*H03K 6/02* (2006.01)

(52) U.S. Cl.
CPC ... *H03K 6/04* (2013.01); *H03K 6/02* (2013.01)

(58) Field of Classification Search
None
See application file for complete search history.

(56) References Cited

U.S. PATENT DOCUMENTS

| | | | | |
|---|---|---|---|---|
| 4,032,855 | A * | 6/1977 | Holman, II | 330/260 |
| 4,551,642 | A * | 11/1985 | Aizawa et al. | 327/333 |
| 5,905,617 | A * | 5/1999 | Kawasoe | 361/86 |
| 2002/0060561 | A1* | 5/2002 | Lim | 323/313 |
| 2002/0153958 | A1* | 10/2002 | Ide | 330/308 |
| 2007/0159250 | A1* | 7/2007 | Tsuchi et al. | 330/253 |
| 2009/0322922 | A1* | 12/2009 | Saito et al. | 348/308 |
| 2012/0092058 | A1* | 4/2012 | Cooney et al. | 327/333 |

FOREIGN PATENT DOCUMENTS

KR 1020020090834 12/2002

* cited by examiner

*Primary Examiner* — Lincoln Donovan
*Assistant Examiner* — Khareem E Almo
(74) *Attorney, Agent, or Firm* — IP & T Group LLP

(57) ABSTRACT

A buffer circuit includes a buffering unit suitable for buffering an input signal and outputting an output signal and a feedback control unit suitable for adjusting a slew rate of the input signal in response to the output signal.

15 Claims, 3 Drawing Sheets

BUFFER CIRCUIT

CROSS-REFERENCE TO RELATED APPLICATIONS

The present application claims priority of Korean Patent Application No. 10-2013-0094873, filed on Aug. 9, 2013, which is incorporated herein by reference in its entirety.

BACKGROUND

1. Field

Exemplary embodiments of the present invention relate to a semiconductor design technology, and more particularly, to a buffer circuit for receiving and transmitting a signal.

2. Description of the Related Art

In general, a semiconductor device such as a Double Data Rate (DDR) Synchronous Dynamic Random Access Memory (SDRAM) receives commands, addresses, and data from an external device such as a controller and performs various operations. Thus, a buffer circuit for receiving the commands, the addresses and the data is provided in the semiconductor device.

FIG. 1 is a detailed circuit diagram illustrating a conventional buffer circuit.

Referring to FIG. 1, the buffer circuit buffers a positive input signal SIG_IN and a negative input signal /SIG_IN, and outputs an output signal SIG_OUT. The output signal SIG_OUT is transferred to an internal circuit and used in the internal circuit. Here, the positive input signal SIG_IN has a phase opposite to that of the negative input signal /SIG_IN, and the output signal SIG_OUT has a phase identical to that of the positive input signal SIG_IN.

Meanwhile, as semiconductor devices are becoming smaller in size, a circuit having an invisible ultra-fine size may be fabricated. The circuit having the ultra-fine size, however, may have different properties depending on environmental factors such as process, voltage, temperature, or the like. The properties of the circuit may be influenced and changed by the environmental factors. Accordingly, a compensation circuit is to be additionally provided to compensate for the changed properties of the circuit.

In general, the compensation circuit performs an operation to change the properties of the circuit depending on the process, voltage and temperature. For those operations, a detection circuit is to be provided to detect the conditions of process, voltage and temperature. However, since the detection circuit converts analog information into digital information, the detection circuit occupies relatively large area and it may be a burden in a circuit design.

SUMMARY

Exemplary embodiments are directed to a buffer circuit capable of adjusting a slew rate of an input signal by reflecting a skew of an output signal on the input signal.

In an embodiment, a buffer circuit may include a buffering unit suitable for buffering an input signal and outputting an output signal and a feedback control unit suitable for adjusting a slew rate of the input signal in response to the output signal.

In another embodiment, a buffer circuit may include a differential amplifying unit suitable for amplifying differential input signals, and outputting an amplification output signal, a differential control signal generating unit suitable for outputting differential control signals in response to the amplification output signal, and a feedback control unit suitable for adjusting slew rates of the differential input signals in response to the differential control signals, respectively.

In further embodiment, a buffer circuit may include a buffering unit suitable for receiving an input signal through an input terminal and transmitting an output signal by buffering the input signal, a control signal generating unit suitable for generating a control signal in response to the output signal, and a feedback control unit suitable for adjusting a capacitance of the input terminal in response to the control signal.

DETAILED DESCRIPTION

Figure 1:
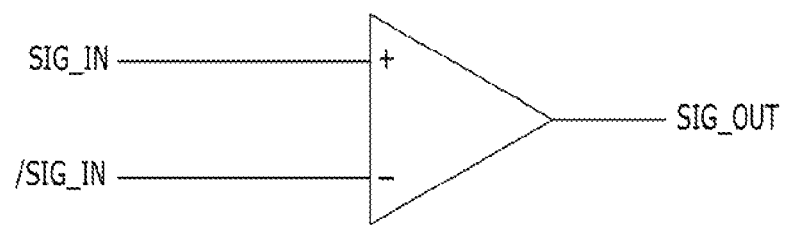
FIG. 1 is a detailed circuit diagram illustrating a conventional buffer circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
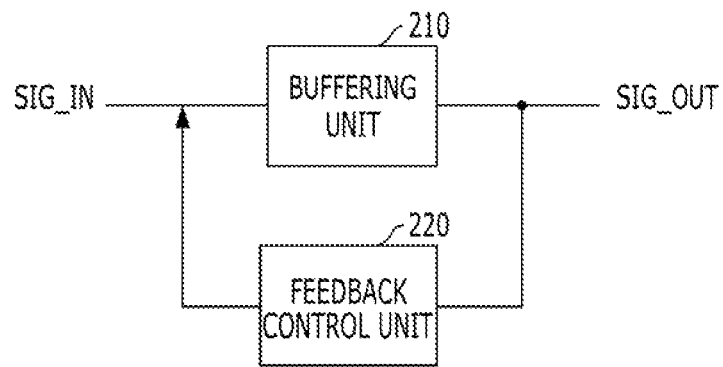
FIG. 2 is a block diagram illustrating a buffer circuit in accordance with an embodiment of the present invention.

FIG. 2 is a block diagram illustrating a buffer circuit in accordance with an embodiment of the present invention.

Referring to FIG. 2, the buffer circuit comprises a buffering unit 210 and a feedback control unit 220. The buffering unit 210 buffers an input signal SIG_IN to output an output signal SIG_OUT. The feedback control unit 220 adjusts a slew rate of the input signal SIG_IN by feeding the output signal SIG_OUT back to the buffering unit 210.

In prefer embodiment, the feedback control unit 220 may include a capacitor and a switch (not shown). The capacitor receives the input signal SIG_IN through a first terminal thereof. The switch is coupled to a second terminal of the capacitor and supplies a source voltage to the capacitor in response to a control signal (not shown) corresponding to the output signal SIG_OUT.

During an operation of the buffer circuit, a skew may occur in the output signal SIG_OUT outputted from the buffering unit 210. The buffer circuit in accordance with the embodiment of the present invention may adjust a slew rate of the input signal SIG_IN in response to the skew reflected on the output signal SIG_OUT.

Figure 3:
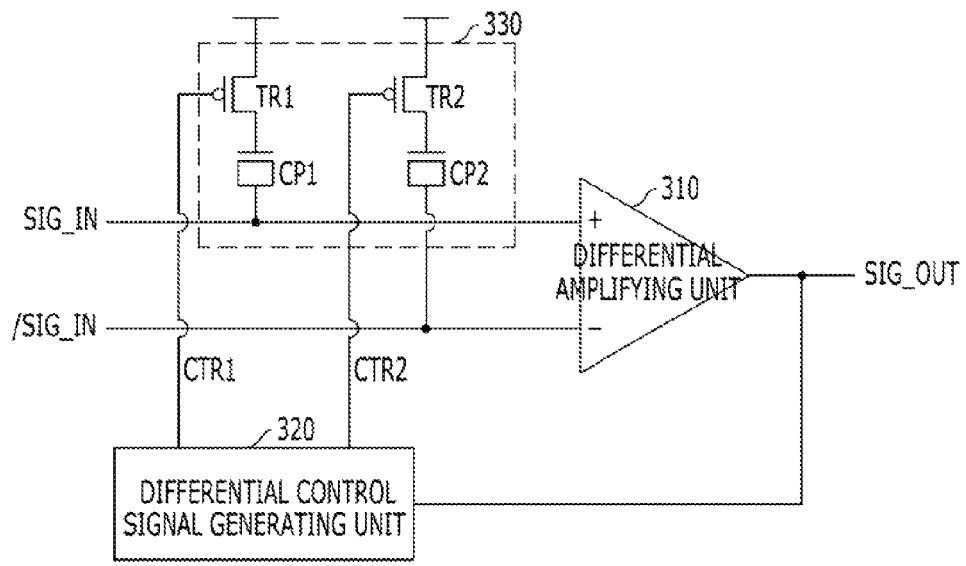
FIG. 3 is a detailed circuit diagram illustrating a buffer circuit in accordance with an embodiment of the present invention.

FIG. 3 is a detailed circuit diagram illustrating a buffer circuit in accordance with an embodiment of the present invention.

Referring to FIG. 3, the buffer circuit comprises a differential amplifying unit 310, a differential control signal generating unit 320, and a feedback control unit 330.

The differential amplifying unit 310 amplifies a positive input signal SIG_IN and a negative input signal /SIG_IN, which are differential input signals, and outputs an amplification output signal SIG_OUT. The differential control signal generating unit 320 receives the amplification output signal SIG_OUT fed back from the differential amplifying unit 310 and outputs first and second control signals CTR1 and CTR2 which are differential control signals. The feedback control unit 330 controls slew rates of the positive input signal SIG_IN and the negative input signal /SIG_IN in response to the first and second control signals CTR1 and CTR2, respectively.

Here, the first and second control signals CTR1 and CTR2 is used to control the slew rates of the positive input signal SIG_IN and the negative input signal /SIG_IN, respectively. The first control signal CTR1 may have a phase opposite to that of the second control signal CTR2.

Meanwhile, the feedback control unit 330 controls the slew rates of the positive input signal SIG_IN and the negative input signal /SIG_IN. For this, the feedback control unit 330 includes a first switch TR1 and a first capacitor CP1 corresponding to the positive input signal SIG_IN. The Feedback control unit 330 also includes a second switch TR2 and a second capacitor CP2 corresponding to the negative input signal /SIG_IN.

The buffer circuit in accordance with the embodiment of the present invention may adjust the slew rates of the positive input signal SIG_IN and the negative input signal /SIG_IN by controlling capacitances reflected on the positive input signal SIG_IN and the negative input signal /SIG_IN, respectively. Increasing the slew rates of the positive input signal SIG_IN and the negative input signal /SIG_IN means that the reliability of the positive input signal SIG_IN and the negative input signal /SIG_IN may be increased.

In detail, the slew rates of the positive input signal SIG_IN and the negative input signal /SIG_IN are adjusted depending on the capacitances reflected on the positive input signal SIG_IN and the negative input signal /SIG_IN, respectively. For example, when the first switch TR1 is turned on in response to the first control signal CTR1, a capacitance of the first capacitor CP1 is reflected on the positive input signal SIG_IN. The capacitance of the first capacitor CP1, however, is not reflected on the positive input signal SIG_IN when the first switch TR1 is turned off. Likewise, when the second switch TR2 is turned on in response to the second control signal CTR2, a capacitance of the second capacitor CP2 is reflected on the negative input signal /SIG_IN. The capacitance of the second capacitor CP2 is not reflected on the negative input signal /SIG_IN when the second switch TR2 is turned off. Since the first and second control signals CTR1 and CTR2 have the opposite phase, the first and second switches TR1 and TR2 may complementarily operate. As the capacitance increases, a transition section becomes longer, and as the capacitance decreases, a transition section becomes shorter. Accordingly, the buffer circuit in accordance with the embodiment of the present invention may improve a signal quality by finely adjusting the capacitance during transition sections of the positive input signal SIG_IN and the negative input signal /SIG_IN.

Hereinafter, another embodiment capable of adjusting the slew rates of the positive input signal SIG_IN and the negative input signal /SIG_IN is explained.

Figure 4:
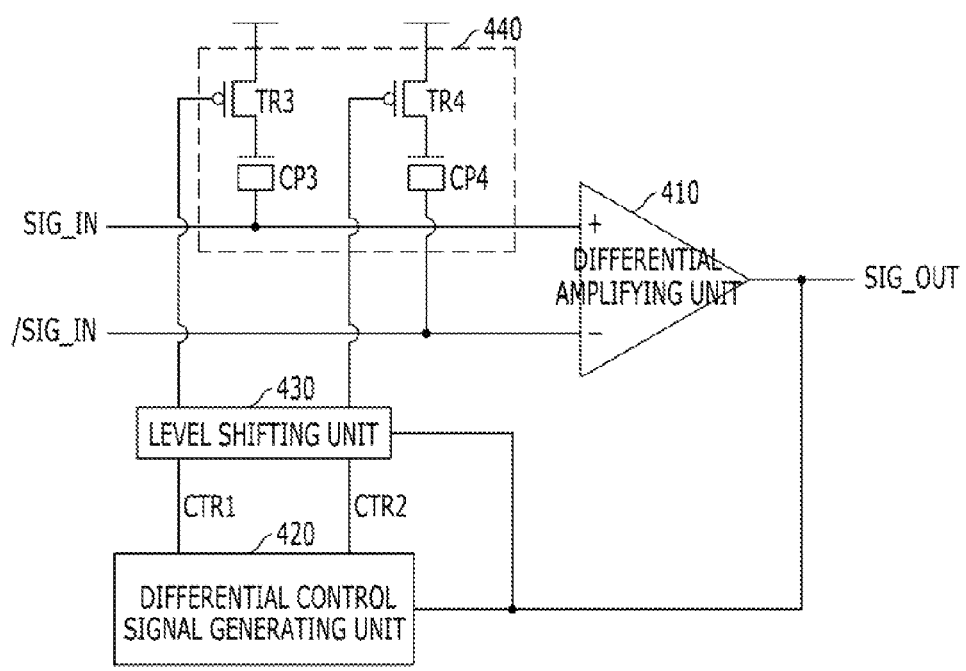
FIG. 4 is a detailed circuit diagram illustrating a buffer circuit in accordance with an embodiment of the present invention.

FIG. 4 is a detailed circuit diagram illustrating a buffer circuit in accordance with an embodiment of the present invention.

Referring to FIG. 4, the buffer circuit comprises a differential amplifying unit 410, a differential control signal generating unit 420, a level shifting unit 430, and a feedback control unit 440.

In the circuit configuration of the buffer circuit shown in FIG. 4, the level shifting unit 430 is further provided in comparison with the circuit configuration of the buffer circuit shown in FIG. 3. Hereinafter, the level shifting unit 430 is mainly explained for the convenience of description.

The level shifting unit 430 receives first and second control signals CTR1 and CTR2 outputted from the differential control signal generating unit 420 to control a level of the first and second control signals CTR1 and CTR2 as a level of an amplification output signal SIG_OUT, and provides third and fourth control signals CTR3 and CTR4 to the feedback control unit 440.

The feedback control unit 440 controls slew rates of a positive input signal SIG_IN and a negative input signal /SIG_IN in response to the third and fourth control signals CTR3 and CTR4. For this, the feedback control unit 440 includes a first switch TR3 and a first capacitor CP3 corresponding to the positive input signal SIG_IN. The feedback control unit 440 also includes a second switch TR4 and a second capacitor CP4 corresponding to the negative input signal /SIG_IN. The first and second switches TR3 and TR4 are turned on to be in different operating conditions in response to the third and fourth control signals CTR3 and CTR4, and thus operate as an active road.

For example, when the first switch TR3 is strongly turned on in response to the third control signal CTR3, a capacitance of the first capacitor CP3 reflected on the positive input signal SIG_IN increases. The capacitance of the first capacitor CP3 reflected on the positive input signal SIG_IN decreases when the first switch TR3 is weakly turned on. Likewise, when the second switch TR4 is strongly turned on in response to the fourth control signal CTR4, a capacitance of the second capacitor CP4 reflected on the negative input signal /SIG_IN increases. The capacitance of the second capacitor CP4 reflected on the negative input signal /SIG_IN decreases when the second switch TR4 is weakly turned on. Since the third and fourth control signals CTR3 and CTR4 have the opposite phase like the first and second control signals CTR1 and CTR2, the first and second switches TR3 and TR4 may complementarily operate.

As the capacitance increases, a transition section becomes longer, and as the capacitance decreases, a transition section becomes shorter. Accordingly, the buffer circuit in accordance with the embodiment of the present invention may improve a signal quality by finely adjusting the capacitance during transition sections of the positive input signal SIG_IN and the negative input signal /SIG_IN.

The buffer circuit in accordance with this embodiment of the present invention may adjust slew rates of the positive input signal SIG_IN and the negative input signal /SIG_IN by controlling a level of the first and second control signals CTR1 and CTR2. Here, the level shifting unit 430 may adjust the level of the first and second control signals CTR1 and CTR2 in response to degree of a skew occurring in the amplification output signal SIG_OUT, a swing width of the amplification output signal SIG_OUT, or the like.

Figure 5:
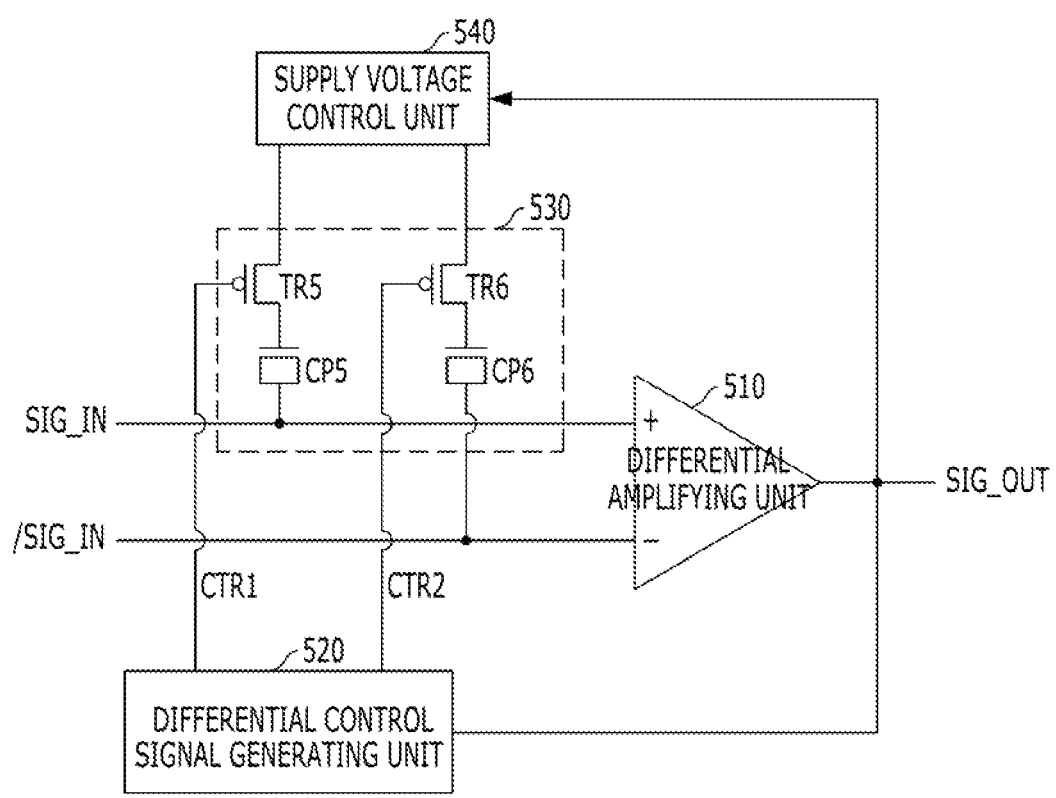
FIG. 5 is a detailed circuit diagram illustrating a buffer circuit in accordance with an embodiment of the present invention.

FIG. 5 is a detailed circuit diagram illustrating a buffer circuit in accordance with yet another embodiment of the present invention.

Referring to FIG. 5, the buffer circuit comprises a differential amplifying unit 510, a differential control signal generating unit 520, a feedback control unit 530, and a supply voltage control unit 540.

In the circuit configuration of the buffer circuit shown in FIG. 5, the supply voltage control unit 540 is further provided in comparison with the circuit configuration of the buffer circuit shown in FIG. 3. Hereinafter, the supply voltage control unit 540 is mainly explained for the convenience of description.

The supply voltage control unit 540 supplies a supply voltage to first and second switches TR5 and TR6 in the feedback control unit 530 to control a level of the supply voltage provided to the feedback control unit 530 in response to an amplification output signal SIG_OUT.

The feedback control unit 530 controls slew rates of a positive input signal SIG_IN and a negative input signal /SIG_IN in response to first and second control signals CTR1 and CTR2. For this, the feedback control unit 530 includes a first switch TR5 and a first capacitor CP5 corresponding to the positive input signal SIG_IN. The feedback control unit 530 also includes a second switch TR6 and a second capacitor CP6 corresponding to the negative input signal /SIG_IN. The first and second switches TR5 and TR6 are turned on to be in different operating conditions in response to the first and second control signals CTR1 and CTR2 and the supply voltage provided from the supply voltage control unit 540, and thus operate as an active road.

For example, when the first switch TR5 is strongly turned on in response to the first control signal CTR1, a capacitance of the first capacitor CP5 reflected on the positive input signal SIG_IN increases. The capacitance of the first capacitor CP5 reflected on the positive input signal SIG_IN decreases when the first switch TR5 is weakly turned on. Likewise, when the second switch TR6 is strongly turned on in response to the second control signal CTR2, a capacitance of the second capacitor CP6 reflected on the negative input signal /SIG_IN increases. The capacitance of the second capacitor CP6 reflected on the negative input signal /SIG_IN decreases when the second switch TR6 is weakly turned on. Since the first and second control signals CTR1 and CT have the opposite phase, the first and second switches TR5 and TR6 may complementarily operate.

As the capacitance increases, a transition section becomes longer, and as the capacitance decreases, a transition section becomes shorter. Accordingly, the buffer circuit in accordance with the embodiment of the present invention may improve a signal quality by finely adjusting the capacitance during transition sections of the positive input signal SIG_IN and the negative input signal /SIG_IN.

The buffer circuit in accordance with this embodiment of the present invention may adjust slew rates of the positive input signal SIG_IN and the negative input signal /SIG_IN by controlling a level of the supply voltage provided to the feedback control unit 530. Here, the supply voltage control unit 540 may adjust the level of the supply voltage provided to the feedback control unit 530 in response to degree of a skew occurring in the amplification output signal SIG_OUT, a swing width of the amplification output signal SIG_OUT or the like.

Accordingly, the buffer circuit in accordance with the embodiment of the present invention may adjust a slew rate of an input signal by reflecting a skew of an output signal on the input signal. As a result, a signal quality may be improved.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors exemplified in the above-described embodiment may be differently realized according to the polarities of the signals inputted thereto.

What is claimed is:

1. A buffer circuit comprising:
    a differential amplifying unit suitable for amplifying a positive input signal and a negative input signal, and outputting an amplification output signal;
    a differential control signal generating unit suitable for receiving the amplification output signal then outputting a first control signal and a second control signal in response to the amplification output signal;
    a level shifting unit suitable for receiving the first control signal and the second control signal to control a level of the amplification signal by outputting a third control signal and a fourth control signal; and
    a feedback control unit suitable for adjusting slew rates of the positive input signal and the negative input signal in response to the third control signal and the fourth control signal, respectively.

2. A buffer circuit comprising:
    a differential amplifying unit suitable for amplifying a positive input signal and a negative input signal, and outputting an amplification output signal;
    a differential control signal generating unit suitable for receiving the amplification output signal then outputting a first control signal and a second control signal in response to the amplification output signal; and
    a feedback control unit suitable for adjusting slew rates of the positive input signal and the negative input signal in response to the first control signal and the second control signal, respectively.

3. The buffer circuit of claim 1, wherein the first control signal has a phase opposite to the second control signal.

4. The buffer circuit of claim 3, wherein the feedback control unit includes a first switch and a first capacitor corresponding to the positive input signal, and a second switch and a second capacitor corresponding to the negative input signal.

5. The buffer circuit of claim 4, wherein the buffer circuit adjusts slew rates of the positive input signal and the negative input signal by controlling capacitances on the positive input signal and the negative input signal.

6. The buffer circuit of claim 5, wherein controlling capacitances of the positive input signal and the negative input signal includes:
    turning the first switch on in response to the first control signal to determine the capacitance of the first capacitor which is reflected on the positive input signal;
    turning the second switch on in response to the second control signal to determine the capacitance of the second capacitor which is reflected on the negative input signal;
    adjusting the capacitance during transition sections of the positive input signal and the negative input signal such that capacitance increases as the transition sections become longer and the capacitance decreases as the transition sections become shorter.

7. The buffer circuit of claim 4, wherein the first switch and the second switch complementary operate due to the first control signal having a phase opposite to the second control signal.

8. The buffer circuit of claim 1, wherein the first control signal has a phase opposite to the second control signal, and the third control signal has a phase opposite to the fourth control signal.

9. The buffer circuit of claim 8, wherein the feedback control unit includes a first switch and a first capacitor corresponding to the positive input signal, and a second switch and a second capacitor corresponding to the negative input signal.

10. The buffer circuit of claim 9, wherein adjusting slew rates of the positive input signal and the negative input signal includes:
   turning the first switch strongly on in response to the third control signal to determine the capacitance of the first capacitor which is reflected on the positive input signal;
   turning the second switch strongly on in response to the fourth control signal to determine the capacitance of the second capacitor which is reflected on the negative input signal;
   adjusting a level of the first control signal and the second control signal by the level shifting unit in response to a degree of skew in the amplification output signal and outputting the third control signal and the fourth control signal, respectively; and
   adjusting the slew rates during a transition section of the positive input signal and a transition section of the negative input signal in response to the third control signal and the fourth control signal.

11. The buffer circuit of claim 9, wherein adjusting slew rates of the positive input signal and the negative input signal includes:
   turning the first switch strongly on in response to the third control signal to determine the capacitance of the first capacitor which is reflected on the positive input signal;
   turning the second switch strongly on in response to the fourth control signal to determine the capacitance of the second capacitor which is reflected on the negative input signal;
   adjusting a level of the first control signal and the second control signal by the level shifting unit in response to a swing width of the amplification output signal and outputting the third control signal and the fourth control signal; and
   adjusting the slew rates during a transition section of the positive input signal and a transition section of the negative input signal in response to the third control signal and the fourth control signal.

12. A buffer circuit comprising:
   a differential amplifying unit suitable for amplifying a positive input signal and a negative input signal, and outputting an amplification output signal;
   a differential control signal generating unit suitable for receiving the amplification output signal then outputting a first control signal and a second control signal in response to the amplification output signal;
   a feedback control unit having a first switch and a first capacitor corresponding to the positive input signal, and a second switch and a second capacitor corresponding to the negative input signal and suitable for adjusting slew rates of the positive input signal and the negative input signal in response to the third control signal and the fourth control signal, respectively; and
   a supply voltage control unit that supplies voltage to the first switch and the second switch of the feedback control unit in response to the amplification output signal.

13. The buffer circuit of claim 12, wherein the first control signal has a phase opposite to the second control signal.

14. The buffer circuit of claim 12, wherein adjusting slew rates of the positive input signal and the negative input signal includes:
   turning the first switch strongly on in response to the third control signal to determine the capacitance of the first capacitor which is reflected on the positive input signal;
   turning the second switch strongly on in response to the fourth control signal to determine the capacitance of the second capacitor which is reflected on the negative input signal;
   adjusting the slew rates during a transition section of the positive input signal and a transition section of the negative input signal resulting from the supply voltage unit adjusting a level of supply voltage provided to the feedback unit in response to a degree of skew in the amplification output signal.

15. The buffer circuit of claim 12, wherein adjusting slew rates of the positive input signal and the negative input signal includes:
   turning the first switch strongly on in response to the third control signal to determine the capacitance of the first capacitor which is reflected on the positive input signal;
   turning the second switch strongly on in response to the fourth control signal to determine the capacitance of the second capacitor which is reflected on the negative input signal;
   adjusting the slew rates during a transition section of the positive input signal and a transition section of the negative input signal resulting from the supply voltage unit adjusting a level of supply voltage provided to the feedback unit in response to a swing width of the amplification output signal.

* * * * *